(12) United States Patent
Ueta et al.

(10) Patent No.: US 6,252,255 B1
(45) Date of Patent: Jun. 26, 2001

(54) CRYSTAL GROWTH METHOD FOR NITRIDE SEMICONDUCTOR, NITRIDE LIGHT EMITTING DEVICE, AND METHOD FOR PRODUCING THE SAME

(75) Inventors: Yoshihiro Ueta, Tenri; Takayuki Yuasa, Nara-ken, both of (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/344,218

(22) Filed: Jun. 25, 1999

(30) Foreign Application Priority Data

Jun. 26, 1998 (JP) .................................................. 10-179899

(51) Int. Cl.[7] .................................................. H01L 33/00
(52) U.S. Cl. .................................................. 257/94
(58) Field of Search .................................................. 257/94

(56) References Cited

U.S. PATENT DOCUMENTS 5,742,628 * 4/1998 Fujii ........................................ 372/45

FOREIGN PATENT DOCUMENTS 57-27999 * 2/1982 (JP) .
09023026 1/1997 (JP) .

* cited by examiner

*Primary Examiner*—Olik Chaudhuri
*Assistant Examiner*—Douglas A. Wille
(74) *Attorney, Agent, or Firm*—Morrison & Foerster LLP

(57) ABSTRACT

A crystal growth method for growing a nitride semiconductor crystal on a sapphire substrate in a vapor phase, includes the steps of: providing a sapphire substrate having a substrate orientation inclined by about 0.05° to about 0.2° from a <0001> orientation; and allowing a nitride semiconductor crystal to grow on the surface of the sapphire substrate.

12 Claims, 4 Drawing Sheets

CRYSTAL GROWTH METHOD FOR NITRIDE SEMICONDUCTOR, NITRIDE LIGHT EMITTING DEVICE, AND METHOD FOR PRODUCING THE SAME

BACKGROUND OF THE INVENTION

1. Field of the Invention

The present invention relates to a method for growing a nitride semiconductor crystal on a sapphire substrate, and a nitride semiconductor light emitting device produced by such a method.

2. Description of the Related Art

Presently, nitride semiconductors are used for ultraviolet to blue lasers. Conventionally, a nitride semiconductor crystal is usually heteroepitaxially grown on a mirror finished sapphire (0001)-plane substrate. As the crystal growth method, a vapor phase growth method such as an MOCVD method or an MBE method is used.

In the MOCVD method, for example, a sapphire (0001)-plane substrate is processed under a reduced atmosphere at about 1000° C., and ammonia is supplied for initial nitridation of the substrate surface. Then, a GaN or AlN buffer layer is formed at a low temperature of about 500° C., and the temperature is increased to about 1000° C., thereby producing a nitride semiconductor crystal.

Japanese Laid-open Patent Publication No. 9-23036 discloses a technique which improves optical characteristics by a 2-step growth method via a buffer layer with the angle between the sapphire substrate surface and the C-face being about 5° or less. However, Japanese Laid-open Patent Publication No. 9-23036 only discloses a technique to improve the luminance of a light emitting device, and does not disclose a technique to improve the flatness of the uppermost surface of a crystal or to reduce the crystal dislocation density thereof. Both the flatness and the crystal dislocation density influence the production process of a light emitting device and the characteristics of the produced light emitting device.

In the above-described MOCVD method, the crystal growth involves an initial nitriding process and a low temperature growth of a buffer layer. This method, however, results in a high dislocation density and an insufficient crystal quality which raise problems particularly for a laser device operated at a high current density. Moreover, simply setting the inclination angle of the substrate surface to about 5° or less does not sufficiently define the step density on the substrate surface, i.e., does not provide a sufficient flatness of the surface. Therefore, the crystal quality and the surface condition of the nitride semiconductor may vary sensitively to variations in the substrate inclination angle.

With an inclination angle ranging from about 0.2° to about 5° as disclosed in the prior art, the nitride semiconductor, e.g., GaN, grown on a (0001)-plane sapphire substrate has dislocations therein at a high density, which are generated from the interface with the sapphire substrate. It is believed that this occurs for the following reasons: three dimensional growth is likely to occur due to a difference in lattice constant between the sapphire substrate and GaN; and the use of the sapphire substrate with an inclination angle ranging from about 0.2° to about 5° with respect to the <0001> orientation results in a non-uniform step distribution on the substrate surface which in turn inhibits a well-regulated step flow growth.

In the heteroepitaxial growth, the buffer layer formed at a low temperature is initially in an amorphous or polycrystalline state, and the atoms therein are then rearranged while increasing the temperature so as to form into a single crystal while receiving information from the substrate. At a high temperature, the buffer layer has an effect of allowing for a crystal growth under conditions similar to those of a homoepitaxial growth. However, in a system with a substantial lattice mismatch such as sapphire and GaN, the effect of the buffer layer is insufficient, and the conditions for forming the buffer layer for absorbing the step difference on the substrate surface due to the inclination angle with respect to the <0001> orientation are limited to narrow ranges.

As does the buffer layer, the initial nitriding process on the substrate surface also has an effect of allowing for a crystal growth under conditions similar to those of a homoepitaxial growth. However, the nitriding process is controlled by the detachment of oxygen atoms near the sapphire surface and the diffusion of nitrogen atoms from the vapor phase, whereby the nitriding process proceeds while remaining the initial shape of the substrate surface. Thus, the steps on the sapphire substrate surface having an inappropriate inclination angle will remain without being substantially affected by the nitriding process, which in turn inhibits a step flow growth and creates dislocations.

FIG. 1 is a schematic microscopic view of such a substrate.

A substrate 101 has a non-uniform distribution of steps 102 on the order of atomic layers. After reaching the substrate surface, a material species undergoes repeated migrations and re-detachments and then reaches a stable site on the substrate surface, i.e., the atomic layer step 102, where it forms a growth nucleus 103. However, the growth nucleus formation also becomes non-uniform reflecting the non-uniform step distribution. Therefore, in a growth process on a substrate with an ill-defined inclination angle, a two dimensional growth (a mode in which each layer is deposited in a plane) is inhibited, and the three dimensional nucleus growth (a mode in which the crystal growth proceeds in a localized manner) becomes dominant, thereby causing a threading dislocation at a location where adjacent grown crystals are coupled with each other.

SUMMARY OF THE INVENTION

According to one aspect of the present invention, a crystal growth method for growing a nitride semiconductor crystal on a sapphire substrate in a vapor phase is provided. The method includes the steps of: providing a sapphire substrate having a substrate orientation inclined by about 0.05° to about 0.2° from a <0001> orientation; and allowing a nitride semiconductor crystal to grow on the surface of the sapphire substrate.

In one embodiment, the substrate orientation is inclined from the <0001> orientation toward a <11–20> orientation or a <1–100> orientation.

According to another aspect of the present invention, a method for producing a nitride semiconductor light emitting device is provided. The method includes the steps of: providing a sapphire substrate having a substrate orientation inclined by about 0.05° to about 0.2° from a <0001> orientation: and providing a layered structure on the sapphire substrate, the layered structure including a quantum well active layer interposed between layers which have conductivity types different from each other.

According to still another aspect of the present invention, a nitride semiconductor light emitting device is provided. The device includes: a first cladding layer of a nitride semiconductor having a first conductivity type; a second cladding layer of a nitride semiconductor having a second conductivity type which is different from the first conductivity type; and a quantum well active layer of a nitride semiconductor interposed between the first and second cladding layers. Interfaces between the active layer and the first and second cladding layers are inclined by about 0.05° to about 0.2° from a <0001> orientation.

An average surface roughness of the cladding layer underlying the quantum well active layer may be less than a thickness of the quantum well active layer.

For example, an average surface roughness of the cladding layer underlying the quantum well active layer may be less than about 1.8 nm.

Thus, the invention described herein makes possible the advantages of: (1) providing a method for growing a nitride semiconductor crystal with an improved surface roughness and an improved crystal quality; (2) providing a nitride semiconductor light emitting device incorporating such a crystal; and (3) providing a method for producing such a light emitting diode.

These and other advantages of the present invention will become apparent to those skilled in the art upon reading and understanding the following detailed description with reference to the accompanying figures.

DESCRIPTION OF THE PREFERRED EMBODIMENTS

Figure 1:
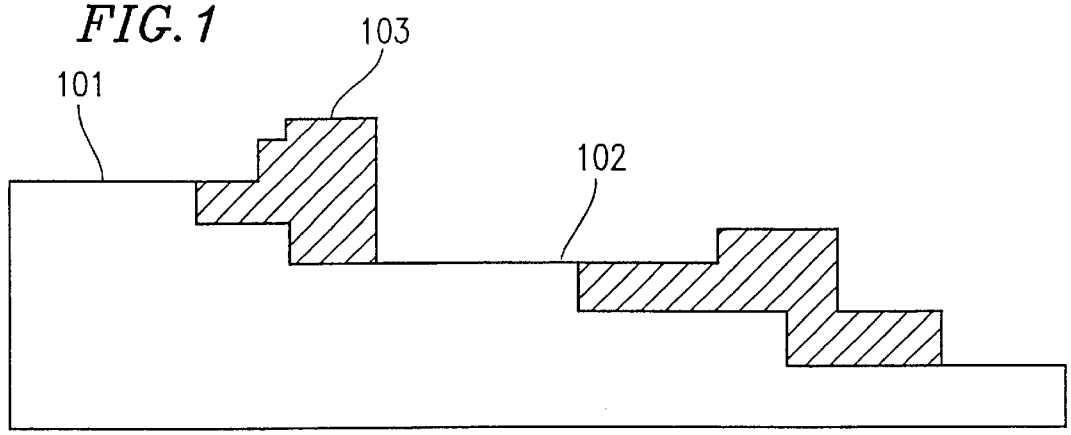
FIG. 1 is a schematic cross-sectional view illustrating a substrate surface with an ill-defined inclination angle and a three dimensional growth thereon.
Figure 2:
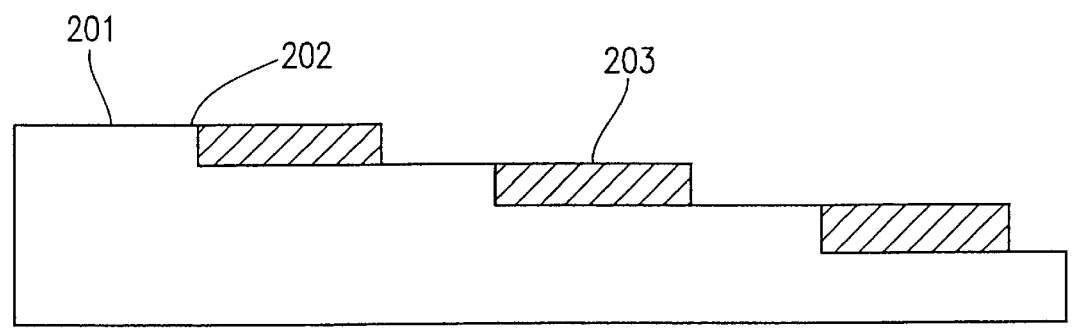
FIG. 2 is a schematic cross-sectional view illustrating a substrate surface with a well-defined inclination angle with respect to the <0001> orientation according to the present invention and a two dimensional growth thereon.
Figure 3:
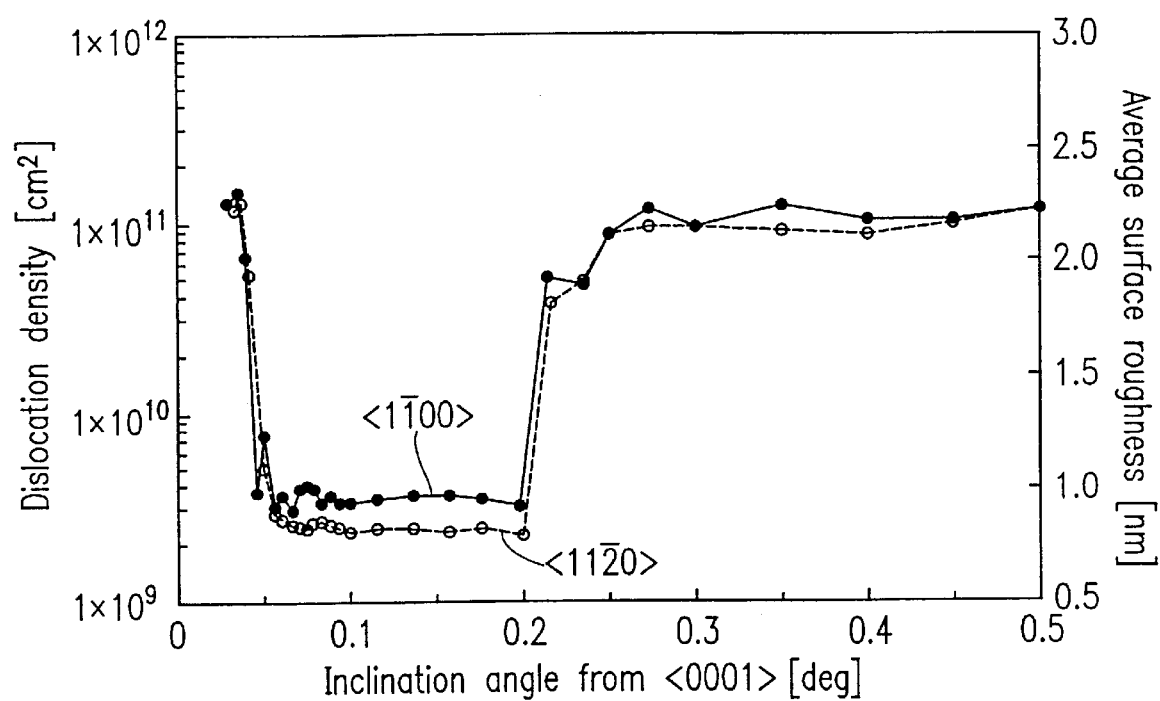
FIG. 3 is a graph showing a relationship of an inclination angle of a sapphire substrate from the <0001> orientation toward the <11–20> or <1–100> orientation with respect to an average surface roughness of a GaN crystal grown on the substrate and a dislocation density of the crystal.

According to the present invention, as shown in FIG. 2, a sapphire substrate 201 is inclined by a defined angle from the <0001> orientation toward the <11–20> or <1–100> orientation so as to achieve a uniform distribution of steps 202 while optimally controlling the step density. As a result, growth nuclei 203 are uniformly grown across the substrate surface, thereby achieving a well-regulated step flow growth and thus a stable two dimensional growth. Thus, dislocation is reduced for inclination angles from about 0.05° to 0.2°, as shown in FIG. 3, thereby improving the surface flatness and the crystal quality. When such a substrate inclined by about 0.05° to 0.2° from the <0001> orientation toward the <11–20> or <1–100> orientation is used, the produced laser or light emitting diode has an improved quality of the nitride semiconductor deposited on the substrate and thus an improved light emitting efficiency. Particularly, when a laser is produced using such a substrate, the operating life of the laser is prolonged.

EXAMPLE 1

A mirror finished sapphire (0001) substrate with an inclination angle of about 0.05° from the <0001> orientation toward the <1–100> orientation was set in a reactor of an ordinary horizontal type MOCVD apparatus. The temperature was increased to about 1100° C. while supplying hydrogen so as to perform a thermal cleaning process for about 10 minutes. Then, the temperature was decreased to about 600° C., and a GaN buffer layer was deposited to be about 50 nm thick. The temperature was again increased to about 1000° C. while supplying ammonia ($NH_3$), and an undoped GaN layer was grown to be about 5 μm thick. A step-meter measurement showed that the GaN layer had desirable crystalline characteristics, with an average surface roughness of about 1.0 nm, a double crystal X-ray diffraction peak (full width at half maximum, hereinafter referred to as "FWHM") of about 2.5 arcmin, an electron concentration of about $4\times10^{15}$ $cm^{-3}$, and a mobility of about 500 $cm^2/V \cdot sec$.

As an alternative example, an AlN buffer layer was deposited, in place of the GaN buffer layer, to be about 50 nm thick on the same substrate at a substrate temperature of about 600° C., and a GaN layer was further grown on the AlN buffer layer. As a result, the GaN layer grown on the buffer layer exhibited desirable crystalline characteristics similar to those described above. Moreover, as another alternative example, a buffer layer and a GaN layer were grown by a method similar to that described above after performing an initial nitriding process on a sapphire substrate surface at about 1100° C. for about 10 minutes in an ammonia atmosphere following the above-described thermal cleaning process. As a result, the grown GaN layer exhibited desirable crystalline characteristics similar to those described above.

COMPARATIVE EXAMPLE 1

For comparison, an undoped GaN layer was grown through substantially the same steps as those of Example 1 using a sapphire substrate which was inclined by about 2.1° from the <0001> orientation toward the <1–100> orientation. As a result, a two dimensional growth was inhibited, and roughness occurred on the surface, resulting in undesirable deteriorated crystalline characteristics, including an average surface roughness of about 2.0 nm, a double crystal X-ray diffraction peak (FWMH) of about 4 arcmin, an electron concentration of about $10^{16}$ $cm^{-3}$, and a mobility of about 90 $cm^2/V \cdot sec$.

As another comparative example, the above-described steps were modified, and the buffer layer was deposited to be about 40 nm thick at a low temperature of about 550° C. As a result, the average surface roughness remained to be about 2.0 nm, while the other crystalline characteristics were slightly improved (about 3.5 arcmin, about $8\times10^{15}$ $cm^{-3}$, and about 200 $cm^2/V \cdot sec$) but were not comparable to those achieved in Example 1 in which the GaN layer was formed using the sapphire substrate having the inclination angle of about 0.05°.

Various GaN layers were formed through substantially the same steps as those of Example 1 and Comparative Example 1 while varying the inclination angle of the sapphire substrate (from the <0001> orientation toward the <1–100> orientation) from about 0.02° to about 0.5°. FIG. 3 shows the measurements of the surface roughness (flatness) and the threading dislocation density of the formed GaN layers (indicated by the symbol "●"). In the range from about 0.2° to about 0.045° and in the range from about 0.21° to about 0.5°, roughness occurred on the surface by a crystal growth failure due to the inclination angle of the sapphire substrate surface.

It was also shown that the surface roughness and the threading dislocation density were substantially in one-toone correspondence to each other, and that the threading dislocation density was suppressed to be on the order of about $10^9$ cm$^{-2}$ in a GaN layer having a surface roughness of about 1.5 nm or less, whereas the threading dislocation density increased to about $5\times10^{10}$ cm$^{-2}$ or more in a GaN layer having a surface roughness over about 1.5 nm. Thus, both the surface roughness and the threading dislocation density were suppressed to lower levels when the inclination of the orientation of the sapphire substrate was in the range from about 0.05° to about 0.2°.

It is believed that when a GaN layer is grown on a substrate which is inclined within such an inclination angle range, a desirable two dimensional growth (where the GaN layer is deposited in single-atom-thick layers) is achieved without a locally-proceeding growth as that observed in a three dimensional nucleus growth, while suppressing the occurrence of threading dislocation in a region where GaN crystals of the localized growth region are in contact with each other (which is characteristic of the three dimensional nucleus growth).

EXAMPLE 2

In Example 2 of the present invention, a sapphire substrate which was inclined in a direction different from that of Example 1 by about 90° was employed. A mirror finished sapphire (0001) substrate with an inclination angle of about 0.15° from the <1000> orientation toward the <11–20> orientation was set in a reactor of an ordinary horizontal type MOCVD apparatus, and an undoped GaN layer was grown through steps similar to those of Example 1. The GaN layer produced according to Example 2 exhibited desirable crystalline characteristics, including an average surface roughness of about 1.1 nm, a double crystal X-ray diffraction peak (FWMH) of about 2.6 arcmin, an electron concentration of about $4\times10^{15}$ cm$^{-3}$, and a mobility of about 500 cm$^2$/V·sec.

As an alternative example, the deposition temperature and the thickness of a GaN, AlN or AlGaN buffer layer provided on the same substrate were varied from about 500° C., to about 650° C. and from about 40 nm to about 70 nm, respectively. As a result, a desirable GaN layer was obtained with substantially the same characteristics as those described above. Moreover, as another alternative example, a step of initially nitriding the sapphire substrate surface in an ammonia atmosphere was additionally performed prior to the formation of the buffer layer. As a result, the crystalline characteristics of the GaN layer were substantially the same as those described above.

COMPARATIVE EXAMPLE 2

For comparison with Example 2, a GaN layer was grown through steps similar to those of Example 2 using a sapphire (0001) substrate which was inclined by about 1.8° toward the <11–20> orientation. As a result, the crystalline characteristics of the GaN layer substantially deteriorated from those of Example 2, and roughness occurred leading to an average surface roughness of about 2.0 nm or more. Moreover, the crystalline characteristics of the GaN layer were not substantially improved when the deposition temperature and the thickness of the GaN, AlN or AlGaN buffer layer were varied from about 500° C. to about 650° C. and from about 40 nm to about 70 nm, respectively, as in Example 2.

Various GaN layers were formed through substantially the same steps as those of Example 2 while varying the inclination angle of the sapphire substrate (from the <1000> orientation toward the <11–20> orientation) from about 0.02° to about 0.5°. FIG. 3 shows the measurements of the surface roughness and the threading dislocation density of the GaN layers (indicated by the symbol "○"). As in the case where a substrate was inclined toward the <1–100> orientation (indicated in FIG. 3 by "●"), when a substrate was inclined toward the <11–20> orientation (indicated by "○"), the average surface roughness increased to about 1.5 nm or more for inclination angles of about 0.045° or less, and for inclination angles of about 0.21° or more.

It was shown that the threading dislocation density also increased to about $5\times10^{10}$ cm$^{-2}$ for such inclination angles. When the orientation of the sapphire substrate was inclined by about 0.05° to about 0.2° from the (0001)-plane toward the <11–20> orientation, the average surface roughness of the GaN layer was significantly reduced to about 0.8 nm. Moreover, the threading dislocation density of a GaN layer having such a small average surface roughness was suppressed to a lower level of about $3\times10^9$ cm$^{-2}$.

As described above, it was shown that the orientation of a sapphire substrate has a substantial effect on the average surface roughness and the threading dislocation density of a GaN crystal layer to be formed thereon. The above-described improvement in the crystallinity was also confirmed when the buffer layer growth conditions (e.g., the substrate temperature, the thickness) were varied, and even when the growth temperature for the GaN layer itself was varied from that of the above-described examples (about 1100° C.) to about 950° C., about 1000° C., about 1150° C., and about 1200° C. Thus, it has been confirmed that it is most important to set the inclination angle of the sapphire substrate orientation within the range of about 0.05° to about 0.2°.

EXAMPLE 3

Figure 4:
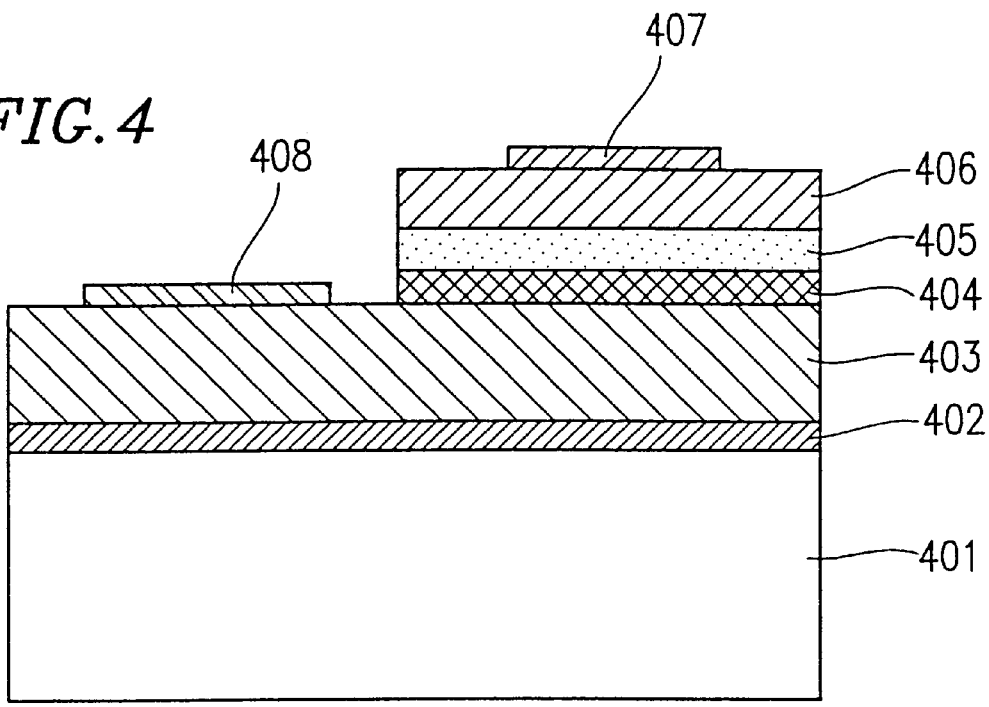
FIG. 4 is a cross-sectional view illustrating an LED according to Example 3 of the present invention.

FIG. 4 illustrates an exemplary light-emitting diode (LED) produced by using a nitride semiconductor of the present invention.

Referring to FIG. 4, the LED includes a sapphire (0001) substrate 401, a GaN buffer layer 402, an n-type GaN contact layer 403, an InGaN active layer 404 of an $In_{0.2}Ga_{0.8}N$ single quantum well layer, a p-type AlGaN protective layer 405, a p-type GaN contact layer 406, a p-type electrode 407, and an n-type electrode 408.

On the mirror finished sapphire (0001) substrate 401 with an inclination angle of about 0.05° from the <0001> orientation toward the <1–100> orientation, the GaN buffer layer 402 was deposited at a substrate temperature of about 600° C. to be about 50 nm thick. Then, the substrate temperature was increased to about 1000° C., and the n-type GaN contact layer 403 was grown by using ammonia, trimethylgallium (hereinafter, referred to as "TMG"), and SiH$_4$. The process was controlled so that the n-type GaN contact layer 403 contains an n-type impurity at a density of about $1\times10^{18}$ cm$^{-3}$.

Then, the substrate temperature was decreased to about 750° C., and the InGaN active layer 404 ($In_{0.2}Ga_{0.8}N$ single quantum well layer) and the Mg-doped p-type $Al_{0.1}Ga_{0.9}N$ protective layer 405 were grown to be about 3.5 nm and about 30 nm, respectively, using ammonia, TMG, and trimethylindium (hereinafter, referred to as "TMI") Thereafter, the substrate temperature was increased again to about 1000° C., and the p-type GaN contact layer 406 was grown to be about 0.5 μm using ammonia, TMG, and biscyclopentadienyl magnesium $(C_5H_5)_2Mg$ (hereinafter, referred to as "Cp$_2$Mg").

After completion of the growth, the substrate was taken out of the apparatus, and subjected to a heat treatment in a nitrogen atmosphere at about 800° C. for about 20 minutes and then to ordinary etching and electrode formation processes, thereby producing an LED. The n-type electrode 408 and the p-type electrode 407 were made of Al and Au/Ni, respectively.

When a forward biased current of about 20 mA was conducted through the produced LED, the emission peak wavelength was about 450 nm, the FWMH of the emission spectrum was about 13 nm, and the luminance was about 2 cd. A measurement of the emission pattern of the LED of Example 3 showed that the InGaN active layer 404 provided uniform emission across the entire surface thereof, and minute emission intensity distribution was not observed. The variation in the emission intensity was suppressed to about ±20% or less.

Also in Example 3, the crystallinity of the surface of the n-type GaN contact layer 403 immediately before growing the InGaN active layer 404 thereon was evaluated.

Unlike in Examples 1 and 2, Si was doped as an impurity into the n-type GaN contact layer 403 to underlie the InGaN active layer 404. However, an evaluation of the average surface roughness and the threading dislocation density showed desirable characteristics as those achieved in Example 1. Although a slight increase in the surface roughness was observed as compared to Example 1 (where Si was not doped), the surface roughness was still at a low level of about 1.1 nm to about 1.2 nm. Thus, it was confirmed that the surface roughness was controlled to be less than the thickness of the InGaN active layer 404 (about 3.5 nm). Moreover, the threading dislocation density was also suppressed to a lower level of about $5 \times 10^9$ cm$^{-2}$.

Various LED devices were produced by substantially the same method as that of Example 3 while varying the substrate inclination angle, and the produced LED devices were evaluated. As a result, a narrowed emission spectrum (FWMH), a more uniform emission intensity distribution, and an improved emission efficiency as those in Example 3 were observed within the inclination angle range of about 0.05° to about 0.2°. Similar effects were confirmed for both the <1–100> orientation and the <11–20> orientation. It is believed that these effects were realized because the surface roughness of the grown nitride semiconductor layer was reduced, whereby it was possible to form an active layer on a very flat film.

COMPARATIVE EXAMPLE 3

For comparison, an LED was produced by substantially the same method as that of Example 3 using a sapphire substrate which was inclined by about 0.25° from the <0001> orientation toward the <1–100> orientation. When a forward biased current of about 20 mA was conducted through the produced LED, the emission peak wavelength was about 450 nm, as in Example 3, but the FWMH of the emission spectrum was about 35 nm (greater than that of Example 3) and the luminance was about 900 mcd. It was thus shown that the emission efficiency decreased from that of Example 3. Moreover, an emission pattern measurement showed a significantly large emission intensity distribution of about ±70% within the device surface.

Thus, the present invention substantially narrows the emission spectrum (FWMH) and substantially improves the color purity and the emission intensity. Moreover, the present invention can make the emission intensity distribution within the device surface more uniform.

Such effects were achieved because the surface of the n-type GaN contact layer 403 underlying the InGaN active layer 404 was flattened so that the average surface roughness thereof was sufficiently smaller than the thickness of the InGaN active layer 404, thereby achieving a uniform thickness of the InGaN active layer 404 within the surface thereof. The effect of narrowing the emission spectrum (FWMH) was confirmed when the average surface roughness of the n-type GaN contact layer 403 was less than the thickness of the InGaN active layer 404. This effect was more significant when the average surface roughness of the n-type GaN contact layer 403 was less than or equal to one half of the thickness of the InGaN active layer 404.

It can be seen that, in Example 3, the average surface roughness of the n-type GaN contact layer 403 is about 1.1 nm to about 1.2 nm, i.e., about 30% to about 40% of the thickness of the InGaN active layer 404 (about 3.5 nm). Similarly, regarding the uniformity of the emission pattern, it was possible to suppress the emission intensity distribution within the device surface to be less than about ±50% by suppressing the surface roughness of the n-type GaN contact layer 403 to be less than the thickness of the InGaN active layer 404. More preferably, it was possible to suppress the emission intensity distribution to about ±25% or less by suppressing the surface roughness to one half or less of the thickness of the InGaN active layer 404.

In a nitride semiconductor light emitting device having a quantum well active layer as that described above, the thickness of the active layer is preferably set to about 3.5 nm or more in order to increase the emission efficiency. Accordingly, the surface roughness of the underlying n-type GaN contact layer 403 is preferably about 1.8 nm (one half of the thickness of the active layer) or less, in which case the effect of providing more uniform emission is significant. It is shown that these conditions are satisfied when the inclination angle of the sapphire substrate surface from the <0001> orientation is about 0.05° to about 0.2°, as shown in FIG. 3, thereby realizing highly uniform and highly efficient light emission.

EXAMPLE 4

Figure 5:
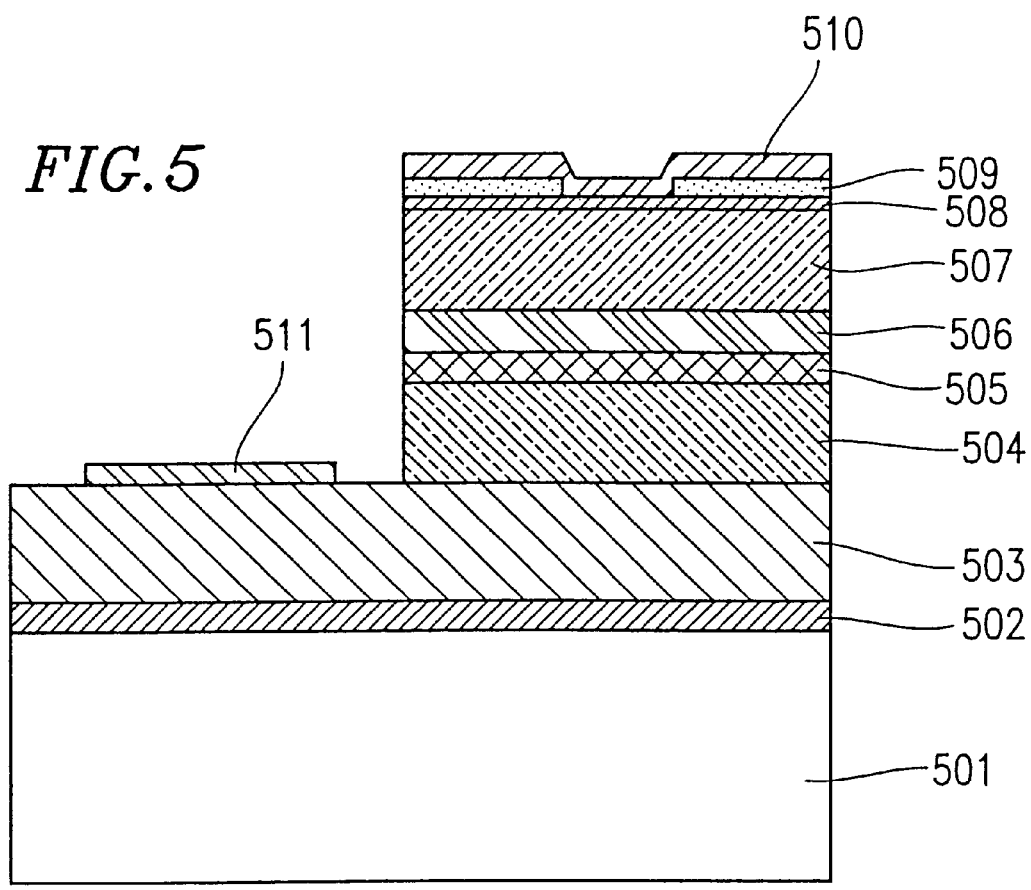
FIG. 5 is a cross-sectional view illustrating a laser device according to Example 4 of the present invention.

FIG. 5 illustrates an exemplary semiconductor laser produced by using a nitride semiconductor of the present invention.

Referring to FIG. 5, the semiconductor laser includes a sapphire substrate 501, a GaN buffer layer 502, an n-type contact layer 503, an n-type cladding layer 504, an active layer 505, a p-type evaporation preventing layer 506, a p-type cladding layer 507, a p-type contact layer 508, a current constriction layer 509, a p-type electrode 510, and an n-type electrode 511.

The mirror finished sapphire (0001) substrate 501 with an inclination angle of about 0.05° from the <0001> orientation toward the <1–100> orientation was set in a reactor of an MOCVD apparatus, and the GaN buffer layer 502 was grown to be about 50 nm thick at a substrate temperature of about 500° C. using ammonia and TMG.

Then, the substrate temperature was increased to about 1000° C., and the n-type GaN contact layer 503 was grown to be about 0.4 μm using ammonia, TMG, and SiH$_4$, and the n-type Al$_{0.15}$Ga$_{0.85}$N cladding layer 504 was grown to be about 0.2 μm using ammonia, TMG, TMA, and SiH$_4$. The layer 504 had an electron concentration of about $2 \times 10^{18}$ cm$^{-3}$. The supply of TMG, TMA, and SiH$_4$ was stopped, the substrate temperature was decreased to about 700° C., and the active layer 505 was grown using ammonia, TMG, and TMI. The active layer 505 included two 1.5 nm thick In$_{0.25}$Ga$_{0.75}$N well layers and three 3 nm thick In$_{0.05}$Ga$_{0.95}$N barrier layers.

Then, the p-type $Al_{0.1}Ga_{0.9}N$ evaporation preventing layer 506 was grown to be about 6 nm thick using ammonia, TMG, TMA, and $Cp_2Mg$. After growing the p-type evaporation preventing layer 506, the substrate temperature was increased to about 1050° C., and the p-type $Al_{0.15}Ga_{0.85}N$ cladding layer 507 was grown to be about 0.2 μm thick using ammonia, TMG, TMA, and $Cp_2Mg$. Then, the supply of TMA was stopped, and the p-type GaN contact layer 508 was grown to be about 0.5 μm thick.

After these steps, the substrate was taken out of the reactor of the MOCVD apparatus, and subjected to a heat treatment in a nitrogen atmosphere at about 800° C. for about 20 minutes so as to activate the p-type impurities contained in the p-type $Al_{0.15}Ga_{0.85}N$ cladding layer 507 and the p-type contact layer 508. Then, the substrate was subjected to ordinary etching and electrode formation processes, and the substrate was cleaved by a scribing or dicing process, thereby producing a laser device. The n-type electrode 511 and the p-type electrode 510 were made of Ti/Al and Au/Ni, respectively.

When a current was conducted through the produced device at room temperature, laser oscillation at a wavelength of about 432 nm was observed at a threshold current of about 40 mA. The threshold voltage was about 4 V. Moreover, at an output of about 5 mW, the driving current was about 47 mA, and the driving voltage was about 4.6 V. It was also confirmed that the device had a operating life of about 10000 hours or longer at room temperature.

The lower oscillation threshold current and the improved reliability resulted from the reduced average surface roughness of the n-type cladding layer 504 underlying the multiple quantum well active layer 505. Example 4 is different from Example 3 in that a layer immediately under the active layer 505 has an Al content of about 15% ($Al_{0.15}Ga_{0.85}N$) and that three layers (including the GaN buffer layer 502) are inserted between the sapphire substrate 501 and the active layer 505. An evaluation of the device of Example 4 on the surface of the n-type cladding layer 504 immediately before growing the active layer 505 showed similar results to those of the undoped GaN layer (indicated by "●" in FIG. 3).

In particular, the average surface roughness of the n-type cladding layer 504 of Example 4 was at a low level of about 1.1 nm to 1.3 nm, and the threading dislocation density thereof was also at a low level of about $5 \times 10^9$ cm$^{-2}$. Thus, the average surface roughness of the n-type cladding layer 504 is less than the thickness (about 1.5 nm) of each quantum well layer of the multiple quantum well active layer 505. This provides the uniform emission pattern (i.e., a uniform gain in the optical guide wave path direction and a reduced absorption loss in the semiconductor laser) and the narrowed emission spectrum (FWMH) (i.e., a narrowed gain (FWMH) in the semiconductor laser).

Thus, it is possible to efficiently realize laser oscillation with a semiconductor laser. As described above, the present invention is not limited to the improvement of the quality of a GaN layer, but also provides a similar effect for AlGaN.

Moreover, similar devices to those of Example 4 were produced with the only change to the inclination angle of the sapphire substrate being from that of the above-described example (about 0.05°) to about 0.15° and about 0.20°. An evaluation showed that the semiconductor laser devices had desirable characteristics, i.e., oscillation threshold currents of about 45 mA and about 50 mA and operating lives at room temperature of about 12000 hours and about 7000 hours, respectively.

COMPARATIVE EXAMPLE 4

For comparison, another laser device similar to that of Example 4 was produced with a sapphire substrate which was inclined by about 0.25° from the <0001> orientation to the <1–100> orientation. When a current was conducted through the produced laser device, laser oscillation of about 432 nm was observed at a threshold current of about 250 mA. The threshold current was about 4 V. Moreover, at an output of about 5 mW, the driving current was about 280 mA, and the driving voltage was about 4.9 V. The device had a operating life of about 100 hours or less at room temperature.

Still another semiconductor laser similar to that of Example 4 was produced using a sapphire substrate with an inclination angle of about 0.03°. The produced semiconductor laser had significantly lower device characteristics than those achieved in Example 4. In particular, the oscillation threshold current was about 100 mA or more, and the operating life at room temperature was about 300 hours or less.

While the present invention has been described above in connection with the illustrative examples, the present invention is not limited to any of the above-described combinations of the material and the layered structure. For example, effects similar to those described above can also be achieved in other semiconductor laser devices such as a semiconductor laser device of a double heterostructure having a combination of an InGaN active layer and AlGaN cladding layers, or a semiconductor laser device having a single or multiple quantum well active layer of a nitride semiconductor. Desirable effects are in particular provided when a quantum well active layer is used, and the characteristics are particularly improved by using an underlying layer having an average surface roughness which is less than the thickness of the quantum well active layer.

As described above, the present invention allows for an epitaxial growth of a nitride semiconductor crystal with improved average surface roughness and crystal quality as compared to those achieved in the prior art. Moreover, the present invention can facilitate a two dimensional growth so as to reduce dislocation in the crystal, whereby light emitting devices and electronic devices produced utilizing the method of the present invention have improved characteristics and prolonged operating lives.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nitride semiconductor light emitting device, comprising:
   a first cladding layer of a nitride semiconductor having a first conductivity type;
   a second cladding layer of a nitride semiconductor having a second conductivity type which is different from the first conductivity type; and
   a quantum well active layer of a nitride semiconductor interposed between the first and second cladding layers, wherein
   interfaces between the active layer and the first and second cladding layers are inclined by about 0.05° to about 0.2° from a <0001> orientation.

2. A nitride semiconductor light emitting device according to claim 1, wherein an average surf ace roughness of the cladding layer underlying the quantum well active layer is less than a thickness of the quantum well active layer.

3. A nitride semiconductor light emitting device according to claim 1, wherein an average surface roughness of the cladding layer underlying the quantum well active layer is less than about 1.8 nm.

4. A nitride semiconductor light emitting device according to claim 1, wherein an orientation for an epitaxial growth of the nitride semiconductor is inclined from the <0001> orientation toward a <11–20> orientation.

5. A nitride semiconductor light emitting device according to claim 1, wherein an orientation for an epitaxial growth of the nitride semiconductor is inclined from the <0001> orientation toward a <1–100> orientation.

6. A nitride semiconductor light emitting device according to claim 1, wherein a threading dislocation density of the quantum well active layer is equal to or less than about the order of $10^{10}$ cm$^{-2}$.

7. A nitride semiconductor light emitting device, comprising:
a pair of light confinement layers which have conductivity types different from each other, and a device structure including a quantum well active layer of a nitride semiconductor interposed between the pair of light confinement layers, wherein the device structure is provided on a substrate having with an outer most surface inclined by about 0.05° to about 0.2° from a <1–100> orientation.

8. A nitride semiconductor light emitting device according to claim 7, wherein an average surface roughness of the light confinement layer underlying the quantum well active layer is less than a thickness of the quantum well active layer.

9. A nitride semiconductor light emitting device according to claim 7, wherein an average surface roughness of the light confinement layer underlying the quantum well active layer is less than about 1.8 nm.

10. A nitride semiconductor light emitting device according to claim 7, wherein an orientation for an epitaxial growth of the nitride semiconductor is inclined from the <1–100> orientation toward a <11–20> orientation.

11. A nitride semiconductor light emitting device according to claim 7, wherein an orientation for an epitaxial growth of the nitride semiconductor is inclined from the <0001> orientation toward a <1–100> orientation.

12. A nitride semiconductor light emitting device according to claim 7, wherein a threading dislocation density of the quantum well active layer is equal to or less than about the order of $10^{10}$ cm$^{-2}$.

* * * * *

UNITED STATES PATENT AND TRADEMARK OFFICE
CERTIFICATE OF CORRECTION

PATENT NO. : 6,252,255 B1 Page 1 of 1
APPLICATION NO. : 09/344218
DATED : June 26, 2001
INVENTOR(S) : Yoshihiro Ueta et al.

It is certified that error appears in the above-identified patent and that said Letters Patent is hereby corrected as shown below:

In Claim 7, column 11, line 24, please replace "<1-100>" with --<0001>--;

In Claim 10, column 12, line 11, please replace "<1-100>" with --<0001>--.

Signed and Sealed this

Twenty-second Day of August, 2006

JON W. DUDAS
*Director of the United States Patent and Trademark Office*